(12) United States Patent
Lam et al.

(10) Patent No.: US 11,227,820 B2
(45) Date of Patent: Jan. 18, 2022

(54) THROUGH HOLE SIDE WETTABLE FLANK (71) Applicant: NEXPERIA B.V., Nijmegen (NL)

(72) Inventors: Kan Wae Lam, Nijmegen (NL); Wai Hung William Hor, Nijmegen (NL); Sven Walczyk, Nijmegen (NL); Hans-Juergen Funke, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/865,533

(22) Filed: May 4, 2020

(65) Prior Publication Data

US 2020/0357728 A1 Nov. 12, 2020

(30) Foreign Application Priority Data

May 7, 2019 (EP) ..................................... 19172982

(51) Int. Cl.
| | |
|---|---|
| *H01L 23/49* | (2006.01) |
| *H01L 23/495* | (2006.01) |
| *H01L 21/56* | (2006.01) |
| *H01L 23/31* | (2006.01) |
| *H01L 23/00* | (2006.01) |

(52) U.S. Cl.
CPC ...... *H01L 23/49565* (2013.01); *H01L 21/561* (2013.01); *H01L 23/3121* (2013.01); *H01L 23/49527* (2013.01); *H01L 24/45* (2013.01); *H01L 24/85* (2013.01); *H01L 24/96* (2013.01); *H01L 24/97* (2013.01)

(58) Field of Classification Search
CPC ............. H01L 23/49565; H01L 21/561; H01L 23/3121; H01L 23/49527; H01L 24/45; H01L 24/85; H01L 24/96; H01L 24/97

USPC ........................................... 257/666; 438/123
See application file for complete search history.

(56) References Cited

U.S. PATENT DOCUMENTS

| | | | | |
|---|---|---|---|---|
| 6,489,218 | B1 * | 12/2002 | Kim ................... | H01L 23/3107 438/460 |
| 6,608,366 | B1 * | 8/2003 | Fogelson ............ | H01L 23/3107 257/666 |
| 2011/0108965 | A1 | 5/2011 | Hess et al. | |
| 2011/0244629 | A1 * | 10/2011 | Gong .................. | H01L 21/4828 438/112 |
| 2011/0263077 | A1 * | 10/2011 | Bai ........................ | H01L 24/97 438/112 |
| 2013/0277817 | A1 | 10/2013 | Takeuchi | |
| 2014/0001616 | A1 * | 1/2014 | Daniels ............. | H01L 23/49541 257/676 |
| 2016/0183369 | A1 * | 6/2016 | Talledo .................. | H05K 1/111 361/767 |
| 2018/0122731 | A1 * | 5/2018 | Komatsu ............... | H01L 21/561 |

OTHER PUBLICATIONS

European Search Report for priority European application No. EP19172982, 9 pages, dated Nov. 11, 2019.

* cited by examiner

*Primary Examiner* — Didarul A Mazumder
(74) *Attorney, Agent, or Firm* — Ohlandt, Greeley, Ruggiero & Perle, LLP (57) ABSTRACT

This disclosure relates to a flank wettable semiconductor device, having: a lead frame including a plurality of leads with a lead end portion and a semiconductor die mounted on the lead frame. The lead end portion comprises a recess portion having a height that corresponds to a thickness of the lead end portion, and a plate member mounted on the leadframe at the lead end portion.

20 Claims, 9 Drawing Sheets

THROUGH HOLE SIDE WETTABLE FLANK

CROSS REFERENCE TO RELATED APPLICATION

This application claims the benefit under 35 U.S.C. § 119(a) of European Application No. 19172982.1 filed May 7, 2019 the contents of which are incorporated by reference herein in their entirety.

BACKGROUND OF THE DISCLOSURE

1. Field of the Disclosure

The present disclosure relates to a flank wettable semiconductor device and an associated method of manufacture. In particular this disclosure relates to leadless semiconductor devices and an associated method of manufacture.

2. Description of the Related Art

Discrete semiconductor devices are capable of being mounted or placed directly onto the surface of a carrier such as a printed circuit board (PCB). Such semiconductor devices are known surface-mount devices (SMD). Using SMDs allows increased speed of producing completed electronic circuits formed on a PCB by using automated pick and place techniques thus reducing the manufacturing time of PCB mounted electronic circuits.

SMDs can be arranged in various package formats such as lead-less Dual Flat No-Lead (DFN), Quad Flat No-Lead (QFN) packages and so on. QFN and DFN packages are commonly used for discrete devices due to the small footprint and the small package height.

Typical semiconductor devices comprise a semiconductor die attached to a lead frame. Bonding pads on the die are electrically connected to leads of the lead frame with bond wires. This assembly is encapsulated with a mould compound, which protects the die and wire bonds from environmental and physical damage.

In QFN or DFN packages, the leads are flush with the sides of the package body. For example, during assembly, an array of packages are assembled simultaneously. After the moulding or encapsulation step, individual devices are formed with a saw singulation step, where adjacent devices are separated using a saw. These device leads are non-wettable at their flanks due to the untreated copper surface that is exposed yet flush with the side walls of the device. That is, due to the manner in which the semiconductor packages are singulated with a saw blade, the surface of the exposed lead or flank is flush with the mould compound of the device such that solder does not readily climb-up or "wick" the flank of the package meaning that the QFN package is not flank wettable during reflow. This makes it difficult to inspect the solder joints after the package has been attached to a substrate or circuit board. Furthermore, this also reduces the solderable area of the leads thus reducing solder strength.

Figure 1:
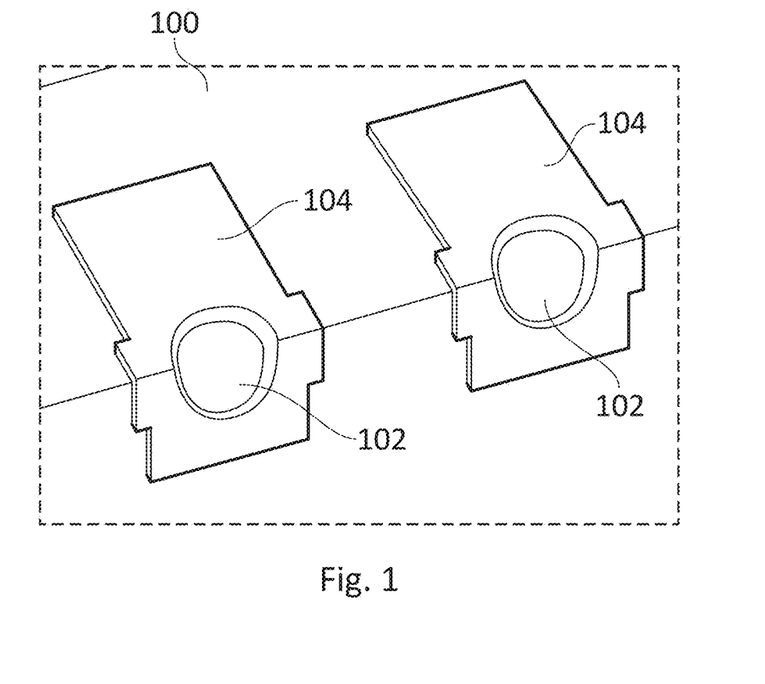
FIG. 1 shows a known recess arrangement for side wettable leads of a semiconductor device.

Arrangements have been proposed for semiconductor devices 100 to overcome the above problems which include the recesses 102 formed in the lead ends 104 of leadframes, as shown for example in FIG. 1. The recesses 102 may be formed as a cut away or etch feature which facilitate the reflow of the solder up the leads ends 104 to improve the solder joint reliability when the device is being mounted to a carrier. The recesses 102 may be formed by stamping or etching the leadframe, or by a step cut process. However, such arrangements require the use of a relatively thick leadframe, in the order of 200 µm, to provide a portion of metal to prevent filling the recess with mould compound. This required portion is arranged as an overhang portion over the top of the recesses 102 which prevents mould compound from forming in or on the recesses 102 during moulding and prior to singulation.

This overhang portion reduces the maximum achievable height of the wettable portion of the leadframe and increases the package thickness for a fixed wettable portion height. A typical example, where solder connections to a PCB are inspected by AOI (automated visual inspection) current inspection criteria require a minimum wettable portion height of 100 µm. Furthermore, because of the singulation process, the full height of the lead end is not wettable.

SUMMARY

Various example embodiments are directed to issues such as those addressed above and/or others which may become apparent from the following disclosure concerning improving automated visual inspection of solder joints and providing for reduced device height.

In certain example embodiments, aspects of the present disclosure relate to full height wettable flanks for semiconductor devices.

According to an embodiment there is provided a flank wettable semiconductor device, comprising: a lead frame including a plurality of leads comprising a lead end portion; a semiconductor die mounted on the lead frame; wherein the lead end portion comprises a recess portion having a height that corresponds to a thickness of the lead end portion, and a plate member mounted on the leadframe at the lead end portion.

The flank wettable semiconductor device may further comprising an encapsulation material that encapsulates the semiconductor die, the lead frame and partially encapsulates the plate member and the lead end portion.

The plate member may be arranged over a top portion of the recess portion. The recess portion may be wettable with a solder material. A coating of protective metal or metal alloy may be formed on the recess portion. The coating may comprise tin or a tin alloy.

The coating may be applied to the recess portion of the leads by electro-plating or electro-deposition prior to the device being separated from an adjacent device during assembly.

A plurality of bond wires may electrically connect the semiconductor die with the leads.

According to an embodiment there is also provided a flank wettable semiconductor device, the method comprising: providing an array of lead frames, wherein individual lead frames are separated by saw streets and each lead frame has a plurality of leads comprising a lead end portion; mounting and attaching semiconductor dies to respective ones of the lead frames; mounting and attaching a plate member on the leadframe at the lead end portion; encapsulating the dies with an encapsulation material; cutting the lead frame array along the saw streets to separate individual devices from adjacent devices, wherein the lead end portion comprises a recess portion having a height that corresponds to a thickness of the lead end portion.

The plate member may be mounted on over a top portion of the recess portion. The recess portion may be wettable with a solder material. A coating of protective metal or metal alloy may be formed on the recess portion. The coating may comprise tin or a tin alloy.

The coating may be applied to the recess portion of the leads by electro-plating or electro-deposition prior to the device being separated from an adjacent device during assembly.

A plurality of bond wires may electrically connect the semiconductor die with the leads.

BRIEF DESCRIPTION OF THE DRAWINGS

A more particular description is made with reference to embodiments, some of which are illustrated in the appended figures, so that the manner in which the features of the present disclosure can be understood in detail. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2A:
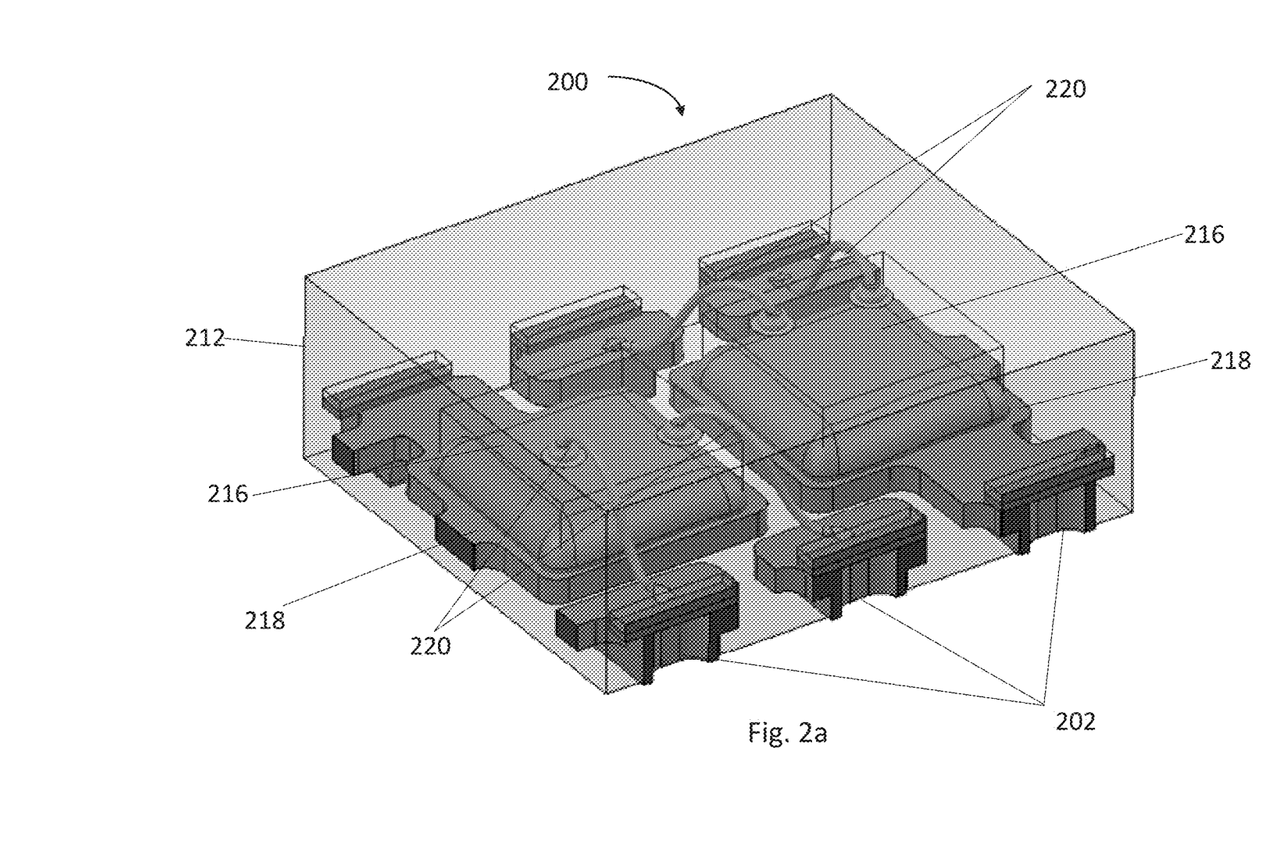
FIGS. 2a and 2b illustrate a semiconductor device according to embodiments.
Figure 2B:
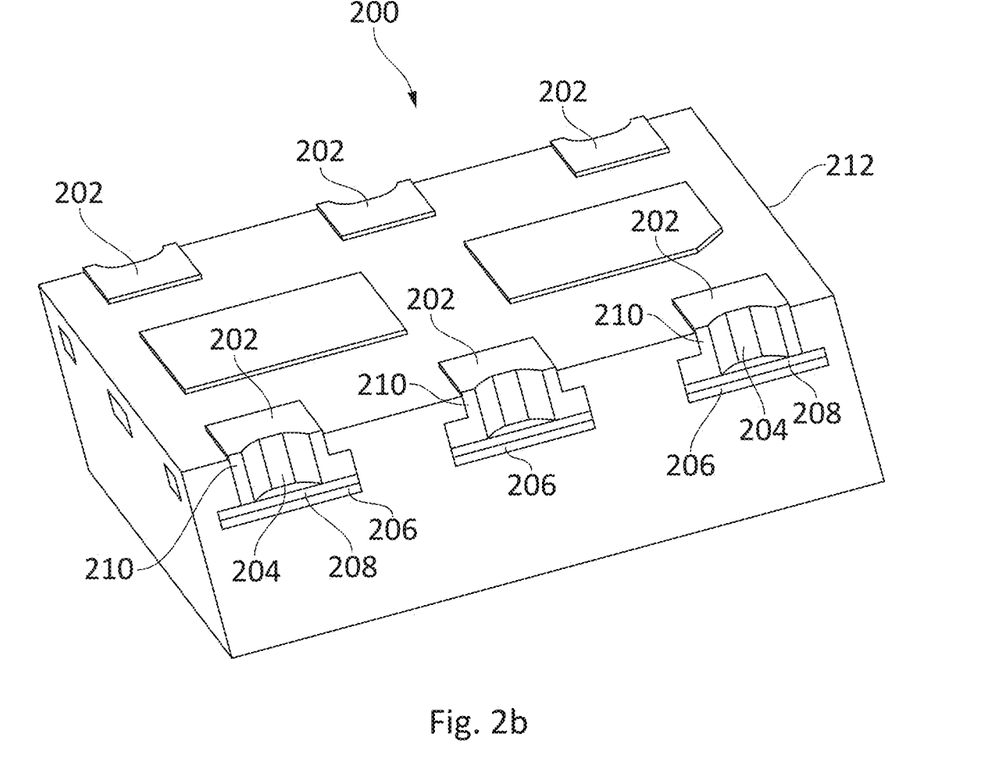

Referring now to FIGS. 2a and 2b a semiconductor device 200 in accordance with a preferred embodiment of the present disclosure is illustrated. FIG. 2a is a transparent front isometric view, and FIG. 2b is a bottom isometric view of the semiconductor device 200. In FIG. 2a the body 212 of the device formed by an encapsulation material as discussed in more detail below, is shown in outline. The device 200 is generally rectangular in shape and in one embodiment the device 200 is of the order of approximately 1.4 mm×1.2 mm×0.5 mm (Length×Width×Height).

The body 212 of the device 200 comprises a plurality of leads 202 arranged on opposing side walls of the body 212. In this embodiment the three leads 202 are arranged on a first side wall and three leads 202 are arranged on an opposing second side wall. In this way the skilled person will see that the device 200 is arranged as a DFN package. The lead ends 202 may be arranged such that they are flush with bottom and side surfaces of the device body 212. Each of the lead ends 202 include a recess 204, which facilitates wicking of solder when the device 200 is attached to a substrate or PCB (not illustrated). The arrangement of the recesses 204 is discussed in more detail below.

As can be seen in FIG. 2a, the device 200 also comprises one of more semiconductor dies 216 mounted on respective die pads 218 on and attached to the lead ends 202. The die pads 218 may be electrically connected to a respective lead end 202, by extension of the lead end 202 to the die pad. Furthermore, the semiconductor dies may be electrically connected to the other lead ends 202 by bond wires 220. Alternatively, the semiconductor dies 216 may be flip-chip dies, having bumps on the die pads 218 such that the semiconductor dies 216 can be electrically connected to the lead ends 202 by placing the die bonding pads in contact with the lead ends 202. The semiconductor dies 216, die pads 218 and bond wires 220 are encapsulated by the encapsulation material which may be a mould compound.

The lead ends 202 comprise a cut away portion or recess 204 which has a height corresponding to the thickness of the lead end 202. In cross-section the recess 204 may be any appropriate shape such as semi-circular, semi-oval, or rectangular. The lead end 202 also comprises a bottom surface 210, which is generally exposed through a bottom surface of the semiconductor device 200 body 212. A top surface of the lead ends 202 opposite the bottom surface 210 is covered by a plate 206 which is affixed to the top surface of the lead ends 202 by an adhesive material 208. The plate 206 may be formed of copper, Kapton tape or other suitable material. Likewise, the plate 206 may be formed of a semiconductor material. By providing the plate 206, the recess 204 is covered at the top surface of the lead ends 202 whilst remaining open at the bottom surface 210. This allows a solder fillet (not illustrated) connecting the semiconductor device 200 to for example a PCB, to form up the entire surface of the recess 204, and also extend on to the bottom surface 210 of the lead end 202.

The thickness of the plate 206 is such that it does not contribute to the overall final (moulded) device 200 height. In this regard the thickness of the plate 206 may be thinner than the semiconductor dies 216. Alternatively, the thickness of the plate 206 may be thinner than the semiconductor dies 216 and any connections thereto such as bond wires 220 or clip connections. The thickness of the plate may be in the region of 25 µm to 50 µm and the thickness of the lead frame array 222 (discussed in more detail below) will be in the region of 100 µm. Compared to the known standard leadframe thickness this results in a height reduction of up to approximately 60%.

This arrangement of recess 204 top surface covered by the plate 206 ensures that mould compound does not contact the recess 204 during formation of the body 212. This further results in a lead end 202, and as discussed below, a lead frame, where the maximum thickness required is equal to the height of the recess 204. This results in a thinner leadframe and/or lead end for a given recess height because no lead end overhang portion is required, thus ensuring that the recess corresponds to the full height of the leadframe/lead end wettable portion and providing a full height solder fillet on the lead end when the device is mounted to, for example a PCB.

Figure 3:
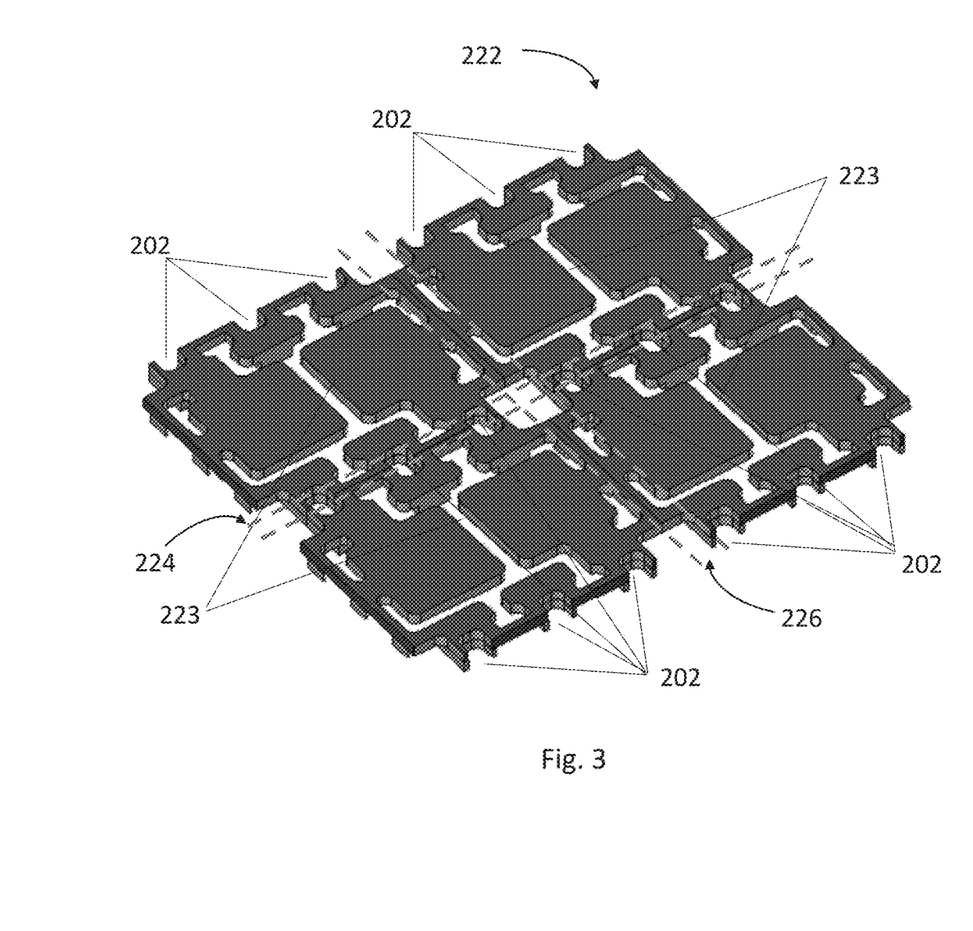
FIG. 3 illustrates a lead frame array for assembly of a semiconductor device according to embodiments.
Figure 4:
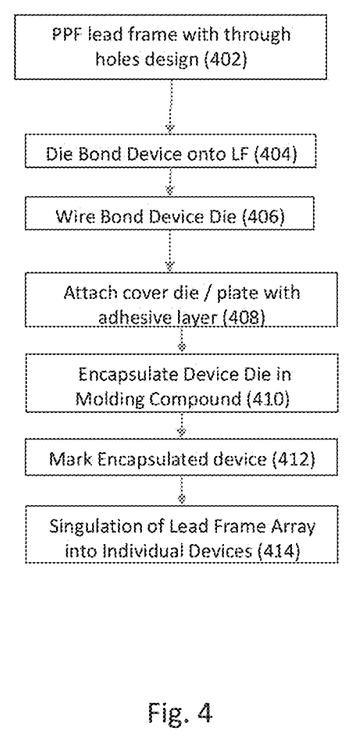
FIG. 4 illustrates a flow chart for an example method of assembling a semiconductor device according to embodiments.

FIG. 3 illustrates a portion of a lead frame array 222 used to assemble the semiconductor device 200, with four individual lead frames 223 being illustrated. The lead frames 223 are separable from each other, as discussed below, by saw streets 224, which run in the X-direction, and saw streets 226, which run in the Y-direction. Each of the lead frames 223 comprises six lead ends 202, three on one side and three on an opposing side which extend from the opposing sides of the lead frames 223. The lead frame array 222 may be formed from a sheet of conductive metal, such as copper, and may be pre-plated (PPF) as shown in FIG. 4 or, not illustrated, post-plated with Sn on either the PPF or Cu surface. The lead frame array 222 may be etched or stamped at the lead ends 202 to form the respective recesses 204.

Through holes 202 (which form the recesses after singulation) extend through the lead frame array 222 and are provided in the vicinity of the saw lanes 224. The through width of the through holes 202 are bigger than the saw lanes 224 such that following singulation, as discussed below, the recesses remain that extend to the full height of the lead ends/lead frame array. The depth of the recesses 204 are the full height of the lead frame thickness and can be achieved by a standard lead frame full etch or cutting process. The die pads 218 are sized and shaped to receive semiconductor dies 216.

Lead frame arrays formed from a sheet of metal, such as copper, etching of lead frame arrays, and plating of lead frame arrays are outside the scope of the present disclosure and thus not necessary for a complete understanding of the present disclosure.

FIG. 4 is a flow chart illustrating an example method of manufacturing a semiconductor device 200 according to an embodiment.

Figure 5A:
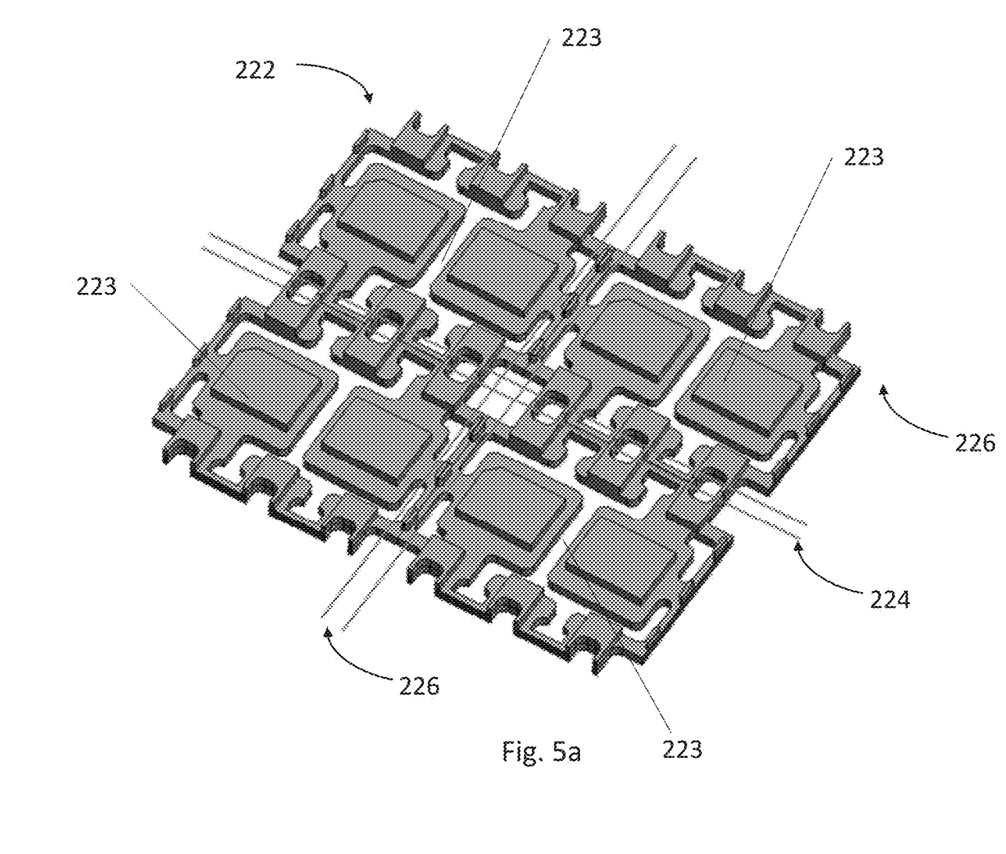
FIGS. 5a to 5e illustrate example steps for manufacturing a semiconductor device according to embodiments.

The method begins at step 402 by providing a lead frame array 222 of the type described above and illustrated in FIG. 5a. A plating step may be performed to plate the leads with a layer of Nickel, Palladium or Gold to prevent corrosion. The plating step can plate the entire lead frame or only selected portions thereof, as desired. The plating layer imparts solderability or solder wettability during a soldering process as well as protecting the exposed surfaces of the lead frame from corrosion.

Figure 5B:
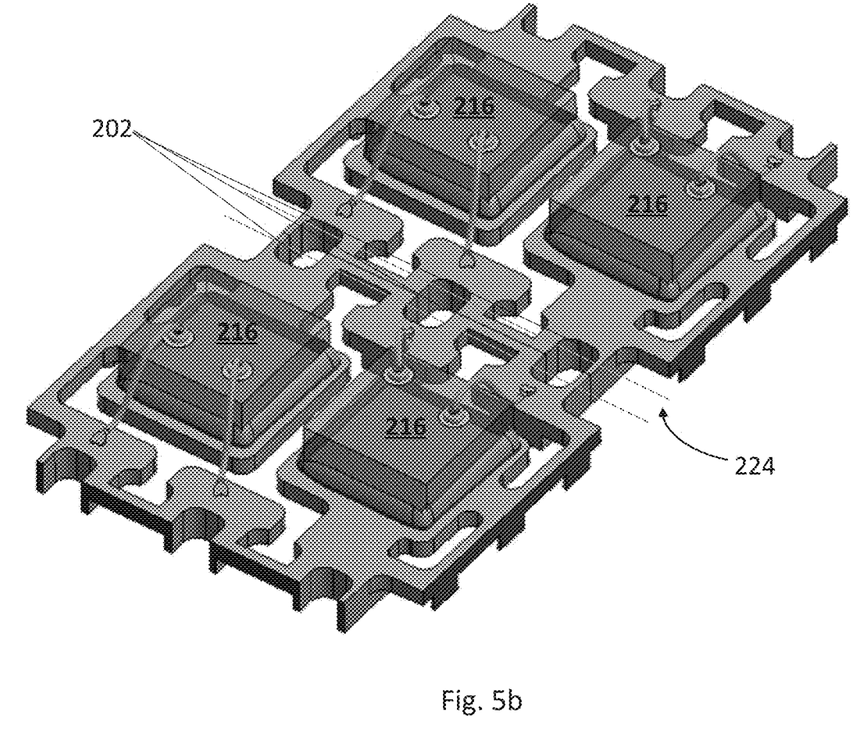

At step 404 a semiconductor die 216 is mounted on and attached to the die pad 218 of the lead frame as illustrated in FIG. 5b. The semiconductor die 216 may be attached by any appropriate adhesive layer, such as solder, eutectic material, double-sided adhesive tape and so on which may allow for electrical connection of the semiconductor die to the die pad. Alternatively, the semiconductor die 216 may be attached to the die pad 218 such that there is no electrical connection between the die pad and the semiconductor die. Following placement of the semiconductor die 216, wire bonding pads arranged on the semiconductor die 216 may be electrically connected to respective wire bonding pads of the lead ends 202 with bond wires 220, at step 406, and as illustrated in FIG. 5b.

In an alternative method, the die may be a flip-chip die and have solder bumps on the die bond pads and then the die is mounted on the lead frame with the die active side facing the lead frame such that the die bond pads are in direct contact with the lead ends.

Figure 5C:
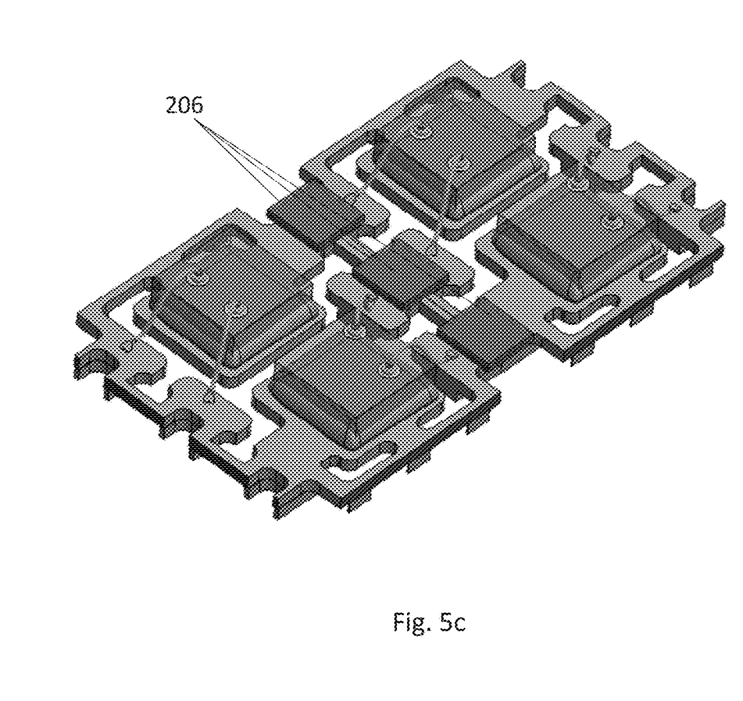
Figure 5D:
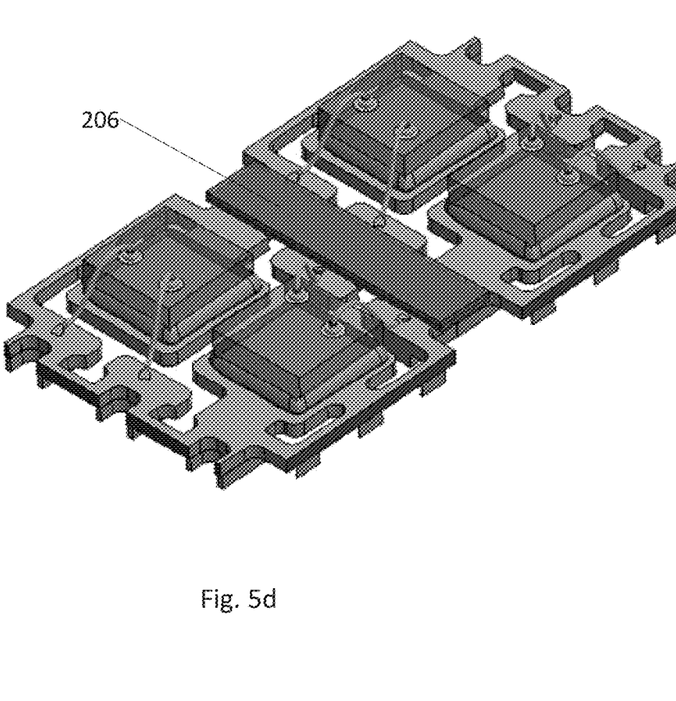

Following placement of the semiconductor dies 216, the process continues at step 408 as illustrated in FIG. 5c, whereby cover plates 206 may be attached on the lead frame array, by means of a suitable adhesive, over the each of the through holes 202 along the direction of the saw lanes. Whilst FIG. 5c, illustrates a discrete cover plate for covering one respective through hole, FIG. 5d illustrates that the cover plate 206 may arranged as single cover plate for covering a plurality of through holes. As an alternative, the cover plate or plates 206 may be pre-applied to the leadframe frame array.

Figure 5E:
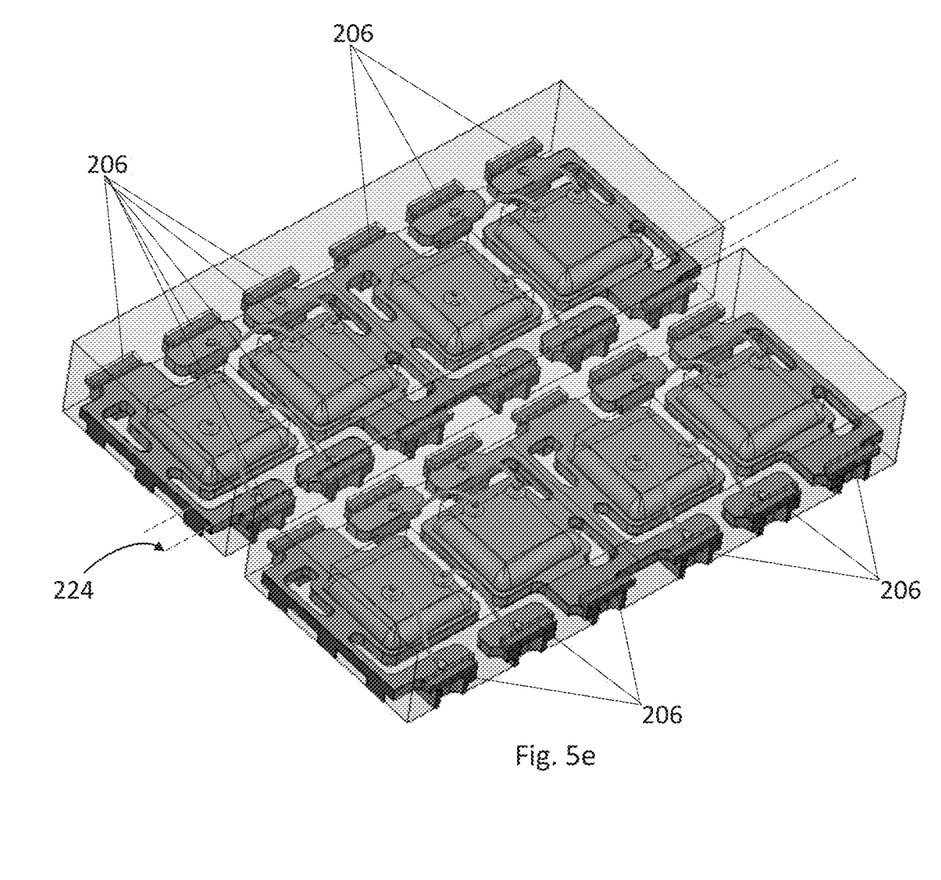

The placement of the cover plate step 408 is followed by an encapsulation or moulding step 410 in which the lead frame, die, cover plate and bond wires are covered with mould compound 212, as is shown in FIG. 5e. The moulding step 410 preferably comprises a mould array process (MAP) where several assemblies formed on a lead frame array are all moulded at the same time, as shown in FIG. 5e.

After the moulding step 410, laser marking is performed in step 412 and if there is a tape on a bottom surface of the lead frame array, then the tape is removed in a de-taping step.

The assemblies are then separated from each other in a singulation step 414 in which a saw blade is run along the saw streets, thereby cutting and separating the simultaneously assembled devices from each other, as illustrated in FIG. 5e. The singulated QFN semiconductor devices of the type described above with respect to FIG. 2b may then be inspected, tested and packed for shipment.

The above describes DFN arrangement, however the skilled person will all appreciate that the present disclosure is also applicable to a QFN arrangement and any number of leads may be arranged on respective sides of the semiconductor device.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination. The term "comprising" does not exclude other elements or steps, the term "a" or "an" does not exclude a plurality. Reference signs in the claims shall not be construed as limiting the scope of the claims.

What is claimed is:

1. A flank wettable semiconductor device, comprising:
a lead frame including a plurality of leads comprising a lead end portion;
a semiconductor die mounted on the lead frame;
wherein the lead end portion comprises a recess portion having a height that corresponds to a thickness of the lead end portion, and a plate member mounted on the leadframe at the lead end portion.

2. The flank wettable semiconductor device of claim 1, further comprising an encapsulation material that encapsulates the semiconductor die, and the lead frame and partially encapsulates the plate member and the lead end portion.

3. The flank wettable semiconductor device of claim 1, wherein the plate member is arranged over a top portion of the recess portion.

4. The flank wettable semiconductor device of claim 2, wherein the plate member is arranged over a top portion of the recess portion.

5. The flank wettable semiconductor device of claim 1, wherein the recess portion is wettable with a solder material.

6. The flank wettable semiconductor device of claim 2, wherein the recess portion is wettable with a solder material.

7. The flank wettable semiconductor device of claim 3, wherein the recess portion is wettable with a solder material.

8. The flank wettable semiconductor device of claim 1, further comprising a coating of protective metal or metal alloy formed on the recess portion.

9. The flank wettable semiconductor device of claim 8, wherein the coating further comprises tin or a tin alloy.

10. The flank wettable semiconductor device of claim 8, wherein the coating is applied to the recess portion of the plurality of leads by electro-plating or electro-deposition prior to the device being separated from an adjacent device during assembly.

11. The flank wettable semiconductor device of claim 1, further comprising a plurality of bond wires that electrically connect the semiconductor die with the plurality of leads.

12. A method of manufacturing a flank wettable semiconductor device, the method comprising:
    providing an array of frames, wherein each lead frames of the array of lead frames are separated by saw streets and each lead frame has a plurality of leads comprising a lead end portion;
    mounting and attaching semiconductor dies to respective ones of the lead frames;
    mounting and attaching a plate member on each lead frame of the array of lead frames at the lead end portion;
    encapsulating the semiconductor dies with an encapsulation material;
    cutting the array of lead frames along the saw streets to separate the flank wettable semiconductor device from a plurality of adjacent semiconductor devices, wherein the lead end portion of each lead frame comprises a recess portion having a height that corresponds to a thickness of the lead end portion.

13. The method of claim 12, wherein the plate member is mounted on over a top portion of the recess portion.

14. The method of claim 12, wherein the recess portion is wettable with a solder material.

15. The method of claim 13, wherein the recess portion is wettable with a solder material.

16. The method of claim 12, further comprising providing a coating of protective metal or metal alloy on the recess portion.

17. The method of claim 16, wherein the coating comprises tin or a tin alloy.

18. The method of claim 16, wherein the coating is applied to the recess portion of the plurality of leads by electro-plating or electro-deposition prior to the flank wettable semiconductor device being separated from an adjacent semiconductor device during assembly.

19. The method of claim 17, wherein the coating is applied to the recess portion of the plurality of leads by electro-plating or electro-deposition prior to the flank wettable semiconductor device being separated from an adjacent semiconductor device during assembly.

20. The method of claim 10, further comprising a plurality of bond wires that electrically connect respective semiconductor dies with the plurality of leads of each of respective lead frames.

* * * * *